(12) United States Patent
Hieda

(10) Patent No.: US 6,750,142 B2
(45) Date of Patent: Jun. 15, 2004

(54) SEMICONDUCTOR DEVICE AND METHOD FOR MANUFACTURING THE SAME

(75) Inventor: Katsuhiko Hieda, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/983,190

(22) Filed: Oct. 23, 2001

(65) Prior Publication Data

US 2002/0048935 A1 Apr. 25, 2002

Related U.S. Application Data

(62) Division of application No. 09/383,961, filed on Apr. 27, 1999, now Pat. No. 6,331,734.

(30) Foreign Application Priority Data

Aug. 28, 1998 (JP) ............................................. 10-243759

(51) Int. Cl.⁷ ..................... H01L 21/44; H01L 21/4763; H01L 23/48; H01L 23/52; H01L 29/40
(52) U.S. Cl. ....................... 438/638; 438/622; 438/652; 438/645; 438/118; 257/750; 257/758; 257/775
(58) Field of Search .............................. 438/638, 645, 438/425, 426, 427, 428, 672, 620

(56) References Cited

U.S. PATENT DOCUMENTS

| 4,808,552 A | * | 2/1989 | Anderson | 438/624 |
|---|---|---|---|---|
| 4,981,550 A | * | 1/1991 | Huttermann et al. | 438/672 |
| 4,987,099 A | * | 1/1991 | Flanner | 438/620 |
| 5,380,680 A | * | 1/1995 | Choi | 438/620 |
| 5,593,927 A | | 1/1997 | Farnworth et al. | 438/113 |
| 5,598,027 A | * | 1/1997 | Matsuura | 257/635 |
| 5,604,156 A | * | 2/1997 | Chung et al. | 438/620 |
| 5,610,099 A | | 3/1997 | Stevens et al. | 438/626 |
| 5,658,830 A | * | 8/1997 | Jeng | 438/620 |
| 5,776,817 A | * | 7/1998 | Liang | 438/427 |
| 5,814,547 A | * | 9/1998 | Chang | 438/329 |
| 5,892,286 A | | 4/1999 | Toyoda et al. | 257/775 |
| 5,893,744 A | * | 4/1999 | Wang | 438/401 |
| 5,905,307 A | | 5/1999 | Onoda | 257/775 |
| 5,969,422 A | * | 10/1999 | Ting et al. | 257/762 |
| 6,018,186 A | * | 1/2000 | Hsu | 257/390 |
| 6,028,000 A | * | 2/2000 | Cho | 438/638 |
| 6,100,177 A | | 8/2000 | Noguchi | 438/620 |
| 6,228,746 B1 | * | 5/2001 | Ibok | 438/425 |
| 6,277,707 B1 | * | 8/2001 | Lee et al. | 438/430 |
| 6,291,352 B1 | * | 9/2001 | Woerlee et al. | 438/699 |
| 6,399,449 B1 | * | 6/2002 | Matsumoto | 438/296 |

FOREIGN PATENT DOCUMENTS

| JP | 10-012745 | 1/1988 |
|---|---|---|
| JP | 03-016242 | 1/1991 |
| JP | 9-321046 | 12/1997 |

* cited by examiner

Primary Examiner—Matthew Smith
Assistant Examiner—Chuong Luu
(74) Attorney, Agent, or Firm—Finnegan, Henderson, Farabow, Garrett & Dunner, L.L.P.

(57) ABSTRACT

A semiconductor device includes a semiconductor substrate on which an element is formed, a lower wiring formed on the semiconductor substrate, and an upper wiring formed on and connected to the lower wiring. The upper wiring includes a plurality of regions having different thicknesses in a continuous wiring region excluding a connection region for connecting the upper and lower wirings.

8 Claims, 11 Drawing Sheets

(LOGIC SECTION)

(DRAM SECTION)

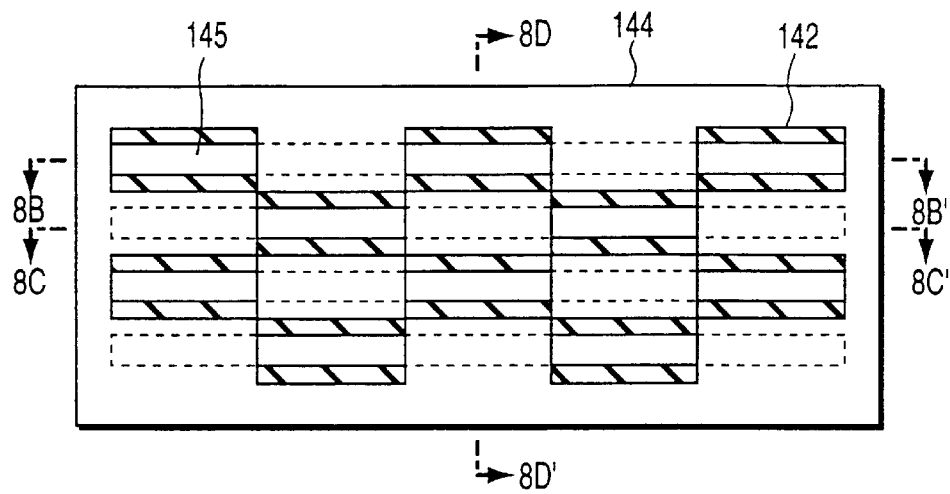
F I G. 8A
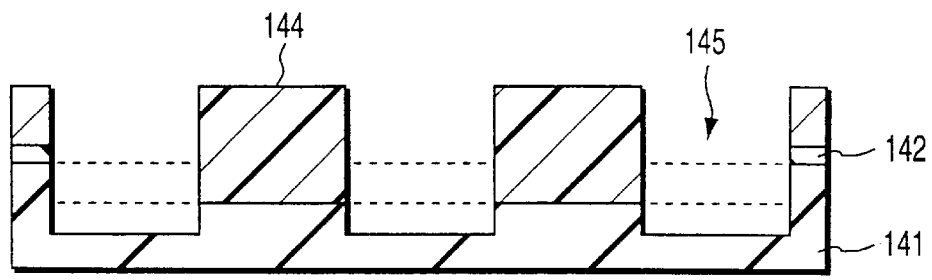
F I G. 8B
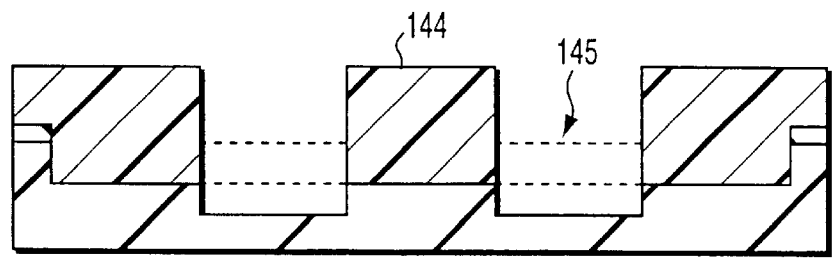
F I G. 8C
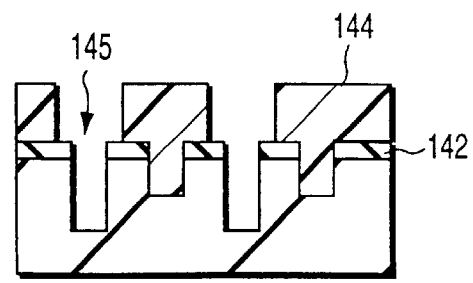
F I G. 8D

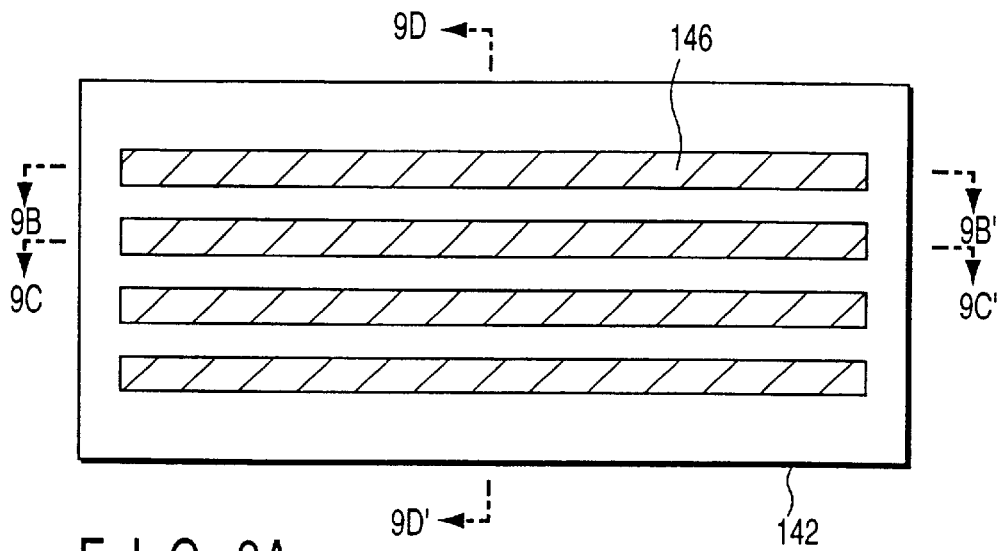
F I G. 9A
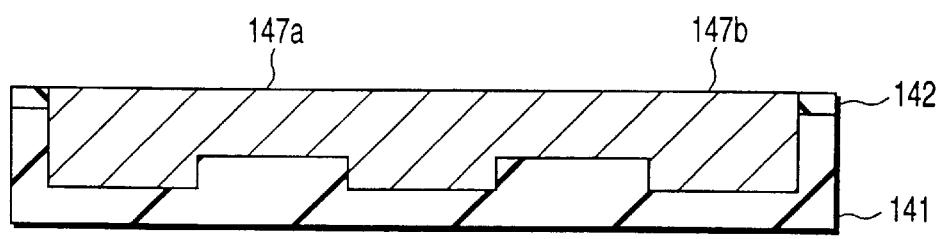
F I G. 9B
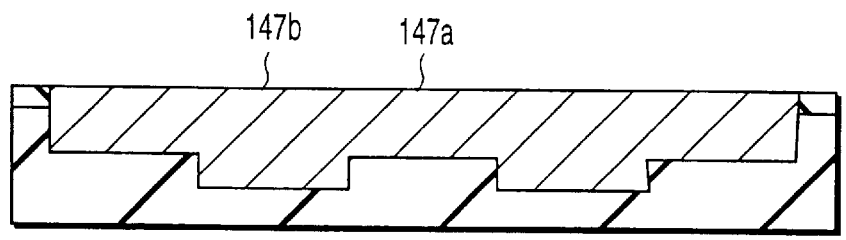
F I G. 9C
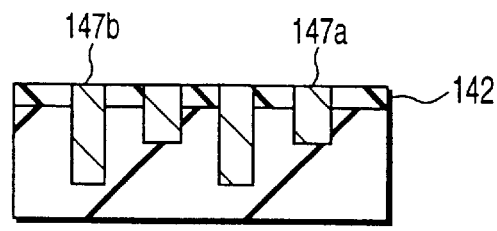
F I G. 9D

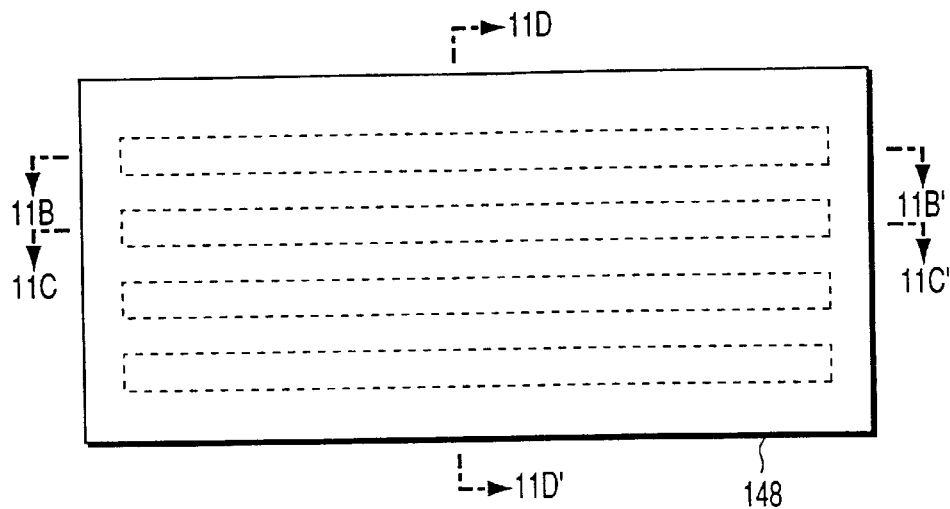
F I G. 11A
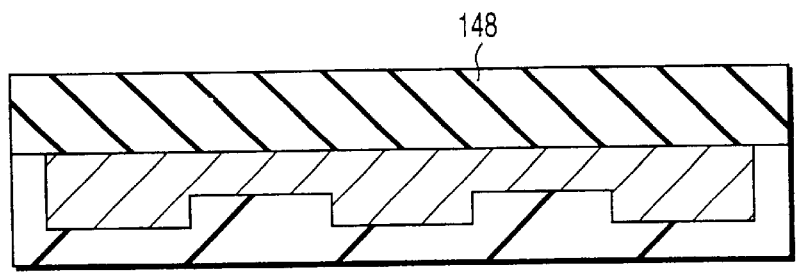
F I G. 11B
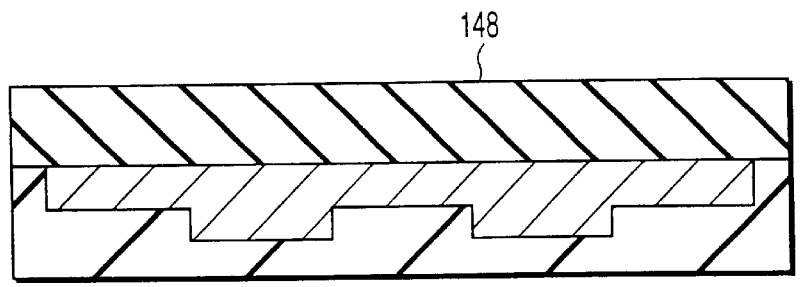
F I G. 11C
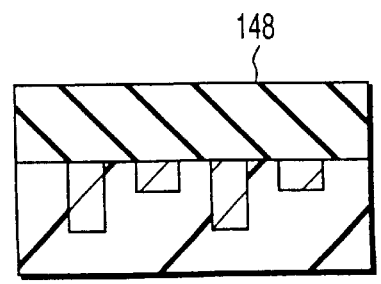
F I G. 11D

SEMICONDUCTOR DEVICE AND METHOD FOR MANUFACTURING THE SAME

This is a division of application Ser. No. 09/383,961, filed Aug. 27, 1999, now U.S. Pat. No. 6,331,734 which is incorporated herein by reference.

BACKGROUND OF THE INVENTION

There has been a demand for lower resistance of wiring in order to perform a high-speed operation of semiconductor elements. It is however undesirable to thicken a wiring formed under design rules (line and space) to lower the resistance of the wiring because the thick wiring increases a wiring-to-wiring capacitance. In general, the decrease in wiring resistance and the reduction in wiring-to-wiring capacitance are contradictory to each other.

A damascene technique is known as a new wiring forming method. In this technique, an insulation film is formed, and a wiring trench is formed in the insulation film and then filled with wiring materials (e.g., metallic materials such as aluminum). A planarization method such as CMP (Chemical Mechanical Polishing) is employed for filling the wiring trench with the wiring materials.

A conventional wiring forming method using a dual damascene technique which is an improvement of the damascene technique, will now be described with reference to FIGS. 12A to 12D.

Referring first to FIG. 12A, a lower wiring layer 203 is formed on a silicon (Si) substrate 201 with an interlayer insulation film 202 therebetween, and a flat interlayer insulation film 204 ($SiO_2$ film) is formed on the lower wiring layer 203. A wiring trench 205 (whose depth is for example 0.5 $\mu$m) is then formed in the $SiO_2$ film 204.

Referring then to FIG. 12B, resist is applied onto the entire surface of the resultant structure and exposed by lithography to form a resist pattern 206 for forming a contact hole. Using this resist pattern 206 as a mask, its underlying $SiO_2$ film 204 is etched to form a contact hole 207 therein.

As shown in FIG. 12C, the resist pattern 206 is exfoliated and then a metal film 208, which is to serves as wiring, is deposited on the whole surface so as to fill both the wiring trench 205 and contact hole 207.

Finally, as illustrated in FIG. 12D, an unnecessary portion of the metal film 208, which exists outside the wiring trench 205 and contact hole 207, is eliminated by CMP.

Consequently, a wiring structure (dual damascene structure) is completed in which both the wiring trench 205 and contact hole 207 are filled with the metal film (wiring) 208.

FIG. 13 shows a lengthwise cross section of the wiring 208 formed by the dual damascene method. Though contact portions 209 of the wiring are also filled with wiring materials, a wiring portion thereof (excluding the contact portions 209) has a uniform thickness.

Even in the wiring forming technique using the dual damascene method, it is difficult to decrease in both wiring resistance and wiring-to-wiring capacitance at the same time. More specifically, the wiring thickness depends upon a relationship between wiring-to-wiring capacitance and wiring resistance at the minimum pitch in which an increase of the wiring-to-wiring resistance is a serious problem, and it is difficult to lower the wiring resistance while preventing the wiring-to-wiring capacitance from increasing when the wiring is more miniaturized by higher degree of integration.

As one method of resolving the above problem, a wiring structure having different wiring depths and its manufacturing method are proposed (Jpn. Pat. Appln. KOKAI Publication No. 9-321046). This method will now be described in brief with reference to FIGS. 14A to 14D.

First, as illustrated in FIG. 14A, an interlayer insulation film 222 is formed on a silicon substrate 221, a lower wiring layer 223 is formed on the film 222, and another interlayer insulation film 224 is formed on the film 222 and layer 223. Trenches 226, 227 and 228 are then formed in the interlayer insulation film 224 using a resist pattern 225 as a mask.

As shown in FIG. 14B, using a resist pattern 229 as a mask, the interlayer insulation film 224 is etched to form a contact hole 230 and wiring trenches 231 and 232.

As shown in FIG. 14C, a metal film 233 serving as wiring is formed on the entire surface of the resultant structure so as to fill the contact hole 230 and wiring trenches 231 and 232.

Finally, as illustrated in FIG. 14D, an unnecessary portion of the metal film 233, which exists outside the contact hole 230 and wiring trenches 231 and 232, is eliminated, thus completing wirings 235 to 238. The wiring 235 is connected to the lower wiring layer 223 through a contact portion 234.

BRIEF SUMMARY OF THE INVENTION

According to the conventional method depicted in FIGS. 14A to 14D, the wirings 235 to 238 having different thicknesses are formed in the same layer, but each wiring has a uniform thickness. The inventors of the present invention do not therefore believe that the conventional method is sufficient for enhancing a degree of flexibility in wiring. In other words, they think it difficult to lower the wiring resistance and reduce the wiring-to-wiring capacitance.

The present invention has been developed to solve the above problem, and its object is to provide a semiconductor device capable of decreasing in both wiring resistance and wiring-to-wiring capacitance at the same time and a method for manufacturing the same.

A semiconductor device according to a first aspect of the present invention comprises a first conductive section formed in a first layer on a semiconductor substrate, and a second conductive section formed in a second layer on the semiconductor substrate and including a connection region connected to the first conductive section and at least one conductive region which varies in thickness.

More specifically, the above semiconductor device has the following structures:

(1) The first conductive section is a wiring or a diffusion layer, and the second conductive section is a wiring. The wiring of the second conductive section is formed above the wiring or diffusion layer of the first conductive section or under the wiring of the first conductive section.

(2) The wiring includes a conductive region which becomes narrower and thicker toward the semiconductor substrate. More specifically, the wiring includes a conductive region which becomes narrower and thicker discontinuously or continuously toward the semiconductor substrate.

(3) An element is formed under a region other than a thickest conductive region of the wiring.

(4) A gate electrode is formed under a region other than a thickest conductive region of the wiring.

According to the present invention, the plural regions having different thicknesses can be arranged properly in a single continuous wiring in relation to its surrounding wirings. The wiring resistance can thus be decreased and so can be the wiring-to-wiring capacitance.

The reason why the regions having different thicknesses are formed in the same wiring in the wiring region excluding the connection region connected to the conductive region, are as follows. The connection region includes a conductive region for connecting the upper and lower wirings and differs in thickness from the original wiring section (the former is thicker than the latter). Such a connection region is therefore excluded from the wiring region of the present invention.

A semiconductor device according to a second aspect of the present invention comprises a first wiring formed on a semiconductor substrate and including a thick region and a thin region, and a second wiring formed adjacent to the first wiring in a same layer as that of the first wiring on the semiconductor substrate and including a thick region and a thin region, wherein the thick region of the first wiring and a thin region of the second wiring are at least partly opposed to each other.

More specifically, the above semiconductor device has the following structures:

(1) The thin region of the first wiring is opposed only to the thick region of the second wiring, and the thick region of the first wiring is opposed only to the thin region of the second wiring.

(2) The thin region of the first wiring is opposed to both the thick region and the thin region of the second wiring, and the thick region of the first wiring is opposed to both the thick region and the thin region of the second wiring.

In the above semiconductor device, the plural wirings are formed adjacent to each other in the same wiring layer and the thin and thick regions are arranged opposite to each other. The capacitance between the wirings can be reduced more effectively.

A semiconductor device according to a third aspect of the present invention 11 comprises a first wiring formed on a semiconductor substrate and having a uniform thickness, and a second wiring formed adjacent to the first wiring in a same layer as that of the first wiring on the semiconductor substrate and including a thick region and a thin region.

More specifically, the above semiconductor device has the following structures:

(1) The thickness of the first wiring is equal to that of the thin region of the second wiring.

Even when only one of adjacent two wirings in the same layer includes both thin and thick regions, if these regions are arranged properly in relation to the surrounding wirings, the wiring resistance can be decreased and the wiring-to-wiring capacitance can be reduced.

A method of manufacturing a semiconductor device according to a fourth aspect of the present invention comprises the steps of forming a first insulation film on a semiconductor substrate and then forming a second insulation film on the first insulation film, etching the second insulation film and then the first insulation film to form a first wiring trench in a multilayer film of the second insulation film and the first insulation film, covering part of the first wiring trench with mask materials, etching the first insulation film using the mask materials and the second insulation film as masks and deepening other part of the first wiring trench, which is not covered with the mask materials, to form a second wiring trench, which is deeper than the first wiring trench, in part of the multilayer film in which the first wiring trench is formed, and forming a wiring in the first wiring trench and the second wiring trench.

More specifically, the above method has the following features:

(1) The first insulation film is a silicon oxide film and the second insulation film is a silicon nitride film.

(2) The step of forming the wiring includes a step of removing the mask materials, a step of forming a conductive film as the wiring on an entire surface of the multilayer film so as to fill the first and second wiring trenches, and a step of removing the conductive film formed outside the first and second wiring trenches.

(3) The conductive film is removed by chemical mechanical polishing.

According to the foregoing method, the second wiring trench is formed by etching the first wiring trench further. In the normal lithography process, for example, the width of an opening pattern for the second wiring trench is set greater than that for the first wiring trench in consideration of out-of-mask-alignment caused between the first and second wiring trenches. As in the prior art of FIGS. 14A to 14D, the second wiring trench is formed in two steps, and width of the second wiring trench is wider than that of the first wiring trench. Consequently, it is thus difficult to enhance the density of the wiring.

Since, in the present invention, the second insulation film, which is subjected to patterning in the step of forming the first wiring trench, is used as an etching mask to form the second wiring trench, the width of the second wiring trench can be equal to that of the first wiring trench. Since, therefore, the width of the wiring can be fixed, an advantage of achieving a high-density wiring as well as that of decreasing both wiring resistance and wiring-to-wiring capacitance can be obtained.

A method of manufacturing a semiconductor device according to a fifth aspect of the present invention comprises the steps of forming a first insulation film on a semiconductor substrate and then forming a second insulation film on the first insulation film, etching the second insulation film and then the first insulation film to form a first wiring trench in a multilayer film of the second insulation film and the first insulation film, removing part of the second insulation film to expose part of the first insulation film, etching the first insulation film using the second insulation film as a mask to form a second wiring trench which is deeper than the first wiring trench and form a third wiring trench, which is shallower than the second wiring trench, in the exposed part of the first insulation film, and forming a wiring in the second and third wiring trenches.

This method has the same specific features as those of the above method.

Since, in this method, the second insulation film, which is subjected to patterning in the step of forming the first wiring trench, is used to form the second wiring trench, the width of the wiring can be fixed and the same advantage as the foregoing advantage can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A to 8D are cross-sectional views of a second step subsequent to the first step shown in FIGS. 7A to 7D;

FIGS. 9A to 9D are cross-sectional views of a third step subsequent to the second step shown in FIGS. 8A to 8D;

FIGS. 11A to 11D are cross-sectional views of a fifth step subsequent to the fourth step shown in FIGS. 10A to 10D;

DETAILED DESCRIPTION OF THE INVENTION

Embodiments of the present invention will now be described with reference to the accompanying drawings.

First Embodiment

FIGS. 1A to 1G illustrate a basic structure of a wiring according to a first embodiment of the present invention.

Figure 1A:
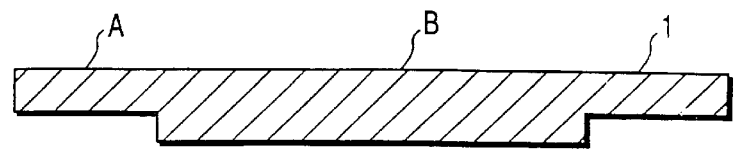
FIGS. 1A to 1G are cross-sectional views depicting a basic structure of wiring according to a first embodiment of the present invention.

First, FIG. 1A shows a single continuous wiring 1 constituted of two portions having a small thickness A (e. g., 0.5 μm) and a large thickness B (e. g., 1.0 μm). A conductive portion of a lower wiring layer or a diffusion layer (not shown) are formed under the wiring 1. The two portions are formed in a region other than the connecting region of the conductive portion and wiring 1.

The wiring 1 is can be formed as a lower wiring layer though it is formed as an upper wiring layer in the first embodiment. In this case, the wiring 1 is connected to an upper wiring layer formed thereon.

The above wiring 1 can be obtained by forming two wiring trenches having different depths in an interlayer insulation film on a semiconductor substrate and then burying the same wiring materials into the wiring trenches at the same time.

Figure 1B:
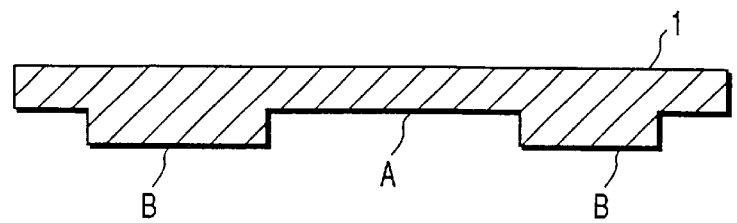

As shown in FIG. 1B, the wiring 1 may include a plurality of portions each having a thickness B. For example, as shown in FIG. 1C, the wiring 1 may include three portions having different thicknesses A, B and C or four or more portions.

Figure 1C:
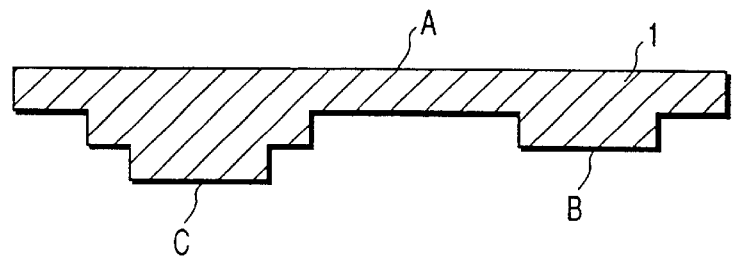
Figure 1D:
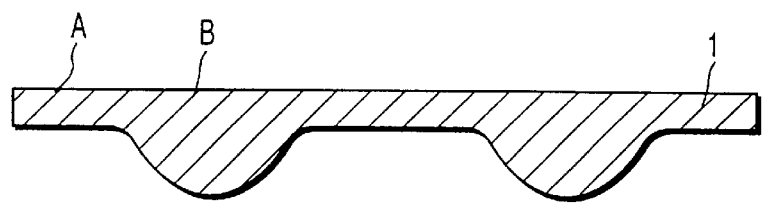

In the wirings illustrated in FIGS. 1A to 1C, the thickness is varied discontinuously. However, as shown in FIG. 1D, the thickness can be varied continuously. In FIG. 1D, the thickness of a thin portion as well as that of a thick portion can be varied continuously.

FIGS. 1A to 1D illustrate a single wiring 1. However, as shown in FIGS. 1E and 1F, a plurality of wirings can be formed in the same layer.

Figure 1E:
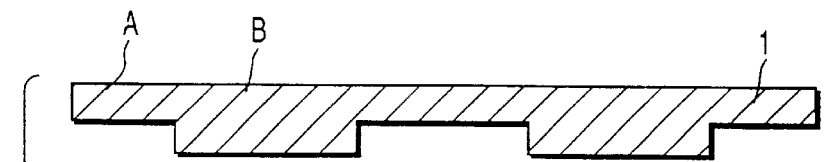

FIG. 1E shows two wirings 1 in which a portion of one wiring 1 having a thickness A is opposed to that of the other wiring 1 having a thickness B and not to that of the other wiring 1 having a thickness A.

Figure 1F:
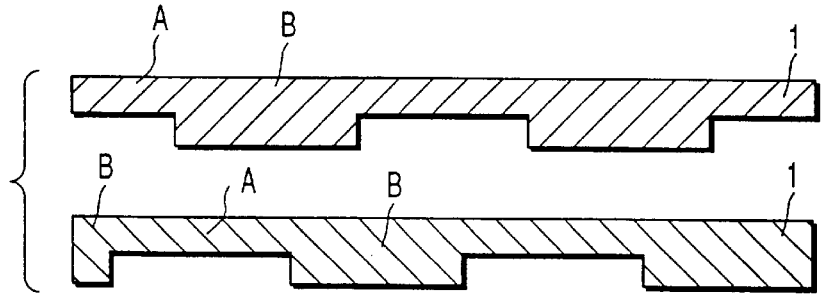

FIG. 1F also shows two wirings 1 in which a portion of one wiring 1 having a thickness A is opposed to portions of the other wiring 1 having thicknesses A and B and so is another portion of one wiring 1 having a thickness B.

Figure 1G:
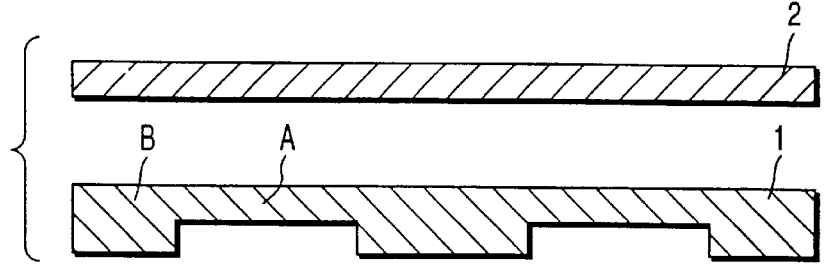

In FIGS. 1E and 1F, two wirings each having plural thicknesses are formed in the same layer. However, as shown in FIG. 1G, one wiring 1 may include two portions having different thicknesses A and B and the other wiring 2 may have a uniform small thickness A. The other wiring 2 may have a uniform large thickness B.

Figure 2:
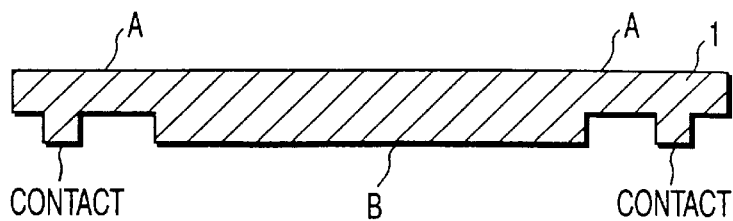
FIG. 2 is a cross-sectional view depicting another basic structure of wiring according to the first embodiment of the present invention.

FIG. 2 depicts a wiring 1 in which a portion having a thickness A (a trench having a depth A) is formed by the dual damascene technique and then a portion having a thickness B (a trench having a depth B) is formed at the same time when a contact hole is formed. In this case, the portion having a thickness B is formed to a depth which is substantially the same as that of the contact hole or which is slightly greater than that of the contact hole.

Second Embodiment

A process of forming a single continuous wiring having a plurality of thicknesses, as described above, will now be described with reference to FIGS. 3A to 3F. In these figures, thin and thick regions are shown right and left separately from each other; however, they are formed in the same continuous wiring.

Figure 3A:
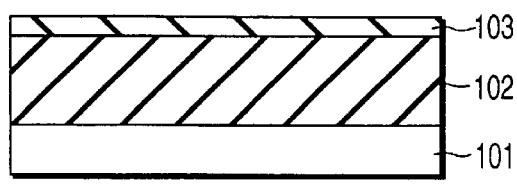
FIGS. 3A to 3F are process cross-sectional views showing a wiring forming method according to a second embodiment of the present invention.

Referring first to FIG. 3A, an element such as a transistor, and necessary contact and wiring (not shown) are formed on a silicon (Si) substrate 101 and then a SiO$_2$ film 102 is formed on the entire surface of the resultant structure as an interlayer insulation film. The SiO$_2$ film 102 is a TEOS-SiO$_2$ film 102 having a thickness of about 800 nm which is formed by CVD or the like. If necessary, the SiO$_2$ film 102 can be densified by heat treatment at a temperature of about 800° C.

The surface of the SiO$_2$ film 102 is flattened. To do so, CMP or another planarization method can be used. For example, a planarization method using heat melt of a BPSG film and a method using a coating film such as SOG can be used alone or in combination.

As illustrated in FIG. 3A, a Si$_3$N$_4$ film 103 having a thickness of about 50 nm is deposited on the SiO$_2$ film 102 by LP-CVD or the like. The Si$_3$N$_4$ film 103 serves as both an etching stopper for deepening a wiring trench by additional etching and a CMP stopper for CMP. If there are CMP conditions enough to employ the SiO$_2$ film 102 as a stopper for CMP, the Si$_3$N$_4$ film 103 can be thinned further.

The Si$_3$N$_4$ film 103 can be replaced with a film containing carbon. In this case, the etching selective ratio can be increased and so can be the CMP selective ratio.

Figure 3B:
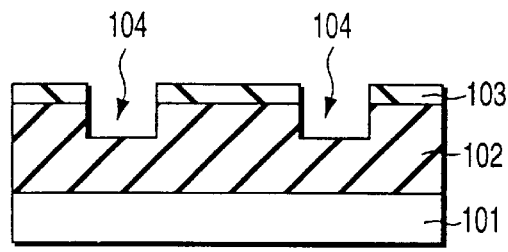

Using a resist film (not shown) having a trench pattern as a mask, as shown in FIG. 3B, the SiO$_2$ film 102 and Si$_3$N$_4$ film 103 are etched by RIE to form a wiring trench 104. The depth of the trench (which is to be the thickness of wiring) is about 400 nm from the surface of the $Si_3N_4$ film 103.

Figure 3C:
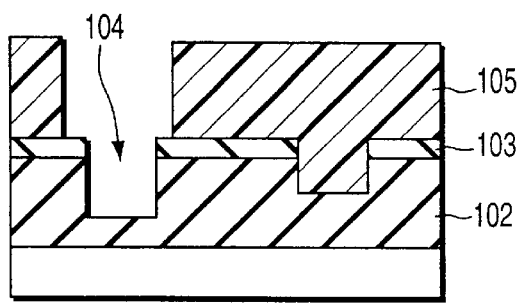

As illustrated in FIG. 3C, a resist film 105 having an opening pattern for deepening the wiring trench further, is formed. Using the resist film 105 and $Si_3N_4$ film 103 as masks, additional etching is performed by RIE to form a wiring trench 106.

The depth of the wiring trench 106 is set to about 700 nm from the surface of the $Si_3N_4$ film 103. In the above additional etching, the etching rate of the $Si_3N_4$ film 103 is ten or more times as low as that of the $SiO_2$ film 102. In other words, the etching condition that the etching selective ratio is ten or more, is employed.

If, as described above, using the $Si_3N_4$ film 103 as an etching mask, the width of the opening pattern of the resist film 105 is made greater than the wiring width of the wiring trench 104, the wiring widths of the trenches 106 and 104 can be made equal to each other.

An interval between the edge of the wiring trench 104 and that of the opening pattern of the resist film 105 depends upon an overlay error and an processing error of a resist pattern. For example, the interval is about 100 nm under the 0.25 μm rule and it is about 60 nm under the 0.15 μm rule.

In order to connect the resist film 105 to a conductive region (wiring) underlying the $SiO_2$ film 102, an opening pattern can be formed on the resist film 105 above the conductive region to form an opening (contact hole) reaching the conductive region at the same time when the wiring trench 106 is formed.

Figure 3D:
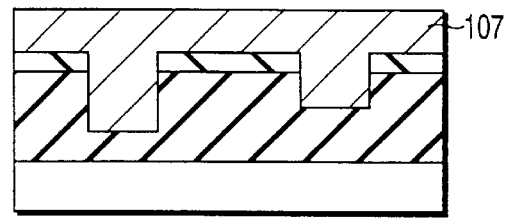

As illustrated in FIG. 3D, after the resist film 105 is exfoliated, a metal film 107, which is to serve as a wiring, is deposited on the entire surface of the resultant structure. The metal film 107 can be constituted of Al (aluminum) or formed to have a multilayer structure in which an aluminum film is deposited on a Ti film and a TiN film. The metal film 107 can also be constituted of Cu (copper), W (tungsten) or the like and replaced with a polysilicon film and a polycide film each containing impurities. The metal film 107 can be formed by sputtering, CVD and plating alone or in combination. It is generally desirable to employ CVD for burying a metal film, which is to serve as a wiring, into a deep wiring trench.

Figure 3E:
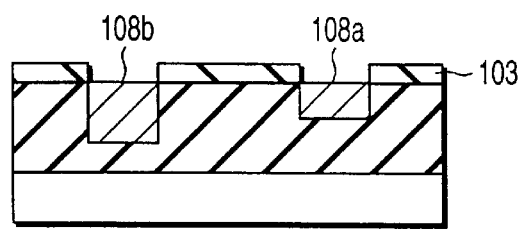

As shown in FIG. 3E, the whole surface is polished by CMP to eliminate an unnecessary portion from the metal film 107 outside the wiring trenches 104 and 106. The $Si_3N_4$ film 103 formed on the surface of the $SiO_2$ film 102 is used as a polishing stopper for the CMP. If the metal film 107 is subjected to CMP such that its surface is dented more than that of the $Si_3N_4$ film 103, a short circuit can be prevented from being caused between adjacent wirings.

The metal film 107 is buried into the wiring trenches 104 and 106, thereby completing a wiring (a single damascene wiring) constituted of a single continuous metal film 107 having a thin wiring region 108a and a thick wiring region 108b in the wiring trenches 104 and 106.

When a contact hole is formed to such a depth as to reach the conductive region under the wiring trench (in the dual damascene wiring), the metal film 107 is buried selectively in this contact hole, too.

Figure 3F:
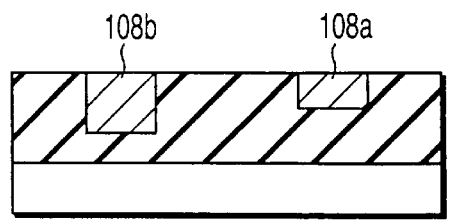

Referring then to FIG. 3F, the $Si_3N_4$ film 103 is removed (or can be left as it is) in order to reduce the capacitance between the metal film 107 and its upper wiring layer (not shown), which is to be formed in the subsequent step, and to prevent a short circuit from being caused between the wirings. An interlayer insulation film (not shown) is then deposited, and the step of FIG. 3F advances to the next one in which the same wiring as that of the second embodiment can be formed.

If, in the step of FIG. 3C, a small level difference is caused on the surface of the $Si_3N_4$ film 103, the film 103 can be exfoliated before the metal film 107 is deposited on the entire surface in the step of FIG. 3D. In this case, the $Si_3N_4$ film 103 cannot be used as a polishing stopper and thus it is necessary to choose a condition for improving a polishing selective ratio between the metal film 107 and $SiO_2$ film 102 for the CMP. For example, the polishing rate of the metal film is set about five times or more as high as that of the $SiO_2$ film.

According to the second embodiment described above, thin and thick regions are provided in the same wiring; therefore, the total wiring resistance can be decreased by the action of the thick region and the wiring-to-wiring capacitance can be reduced by thinning the wiring in a region where the wiring-to-wiring capacitance is to be decreased.

Third Embodiment

A method for forming a wiring according to a third embodiment of the present invention will now be described with reference to FIGS. 4A to 4F. In these figures, thin and thick regions are shown right and left separately from each other; however, they are formed in the same continuous wiring as in the first embodiment shown in FIGS. 3A to 3F. The same constituting elements as those of the first embodiment are denoted by the same reference numerals and their detailed descriptions are omitted.

Figure 4A:
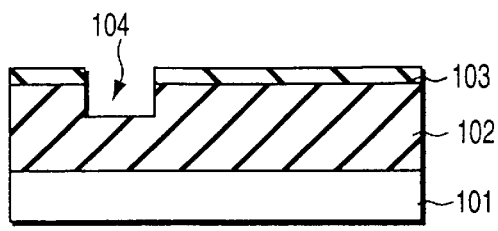
FIGS. 4A to 4F are process cross-sectional views showing a wiring forming method according to a third embodiment of the present invention.

As shown in FIG. 4A, a flattened TEOS-$SiO_2$ film 102 having a thickness of about 800 nm is formed on the entire surface of the structure as an interlayer insulation film, as in the first embodiment. Then, a $Si_3N_4$ film 103 having a thickness of about 50 nm is deposited on the $SiO_2$ film 102, and a wiring trench 104 is formed in the $SiO_2$ film 102 by etching using a resist film (not shown) having a wiring trench pattern in a part of a wiring region as a mask. The depth of the wiring trench 104 is set to about 200 nm from the surface of the $Si_3N_4$ film 103.

Figure 4B:
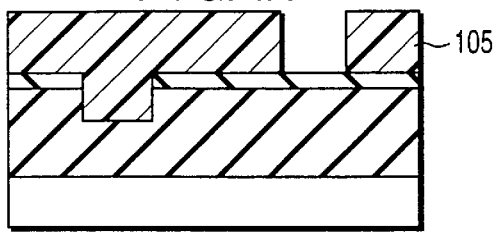

As illustrated in FIG. 4B, using a resist film 105 having a trench pattern in another part of the wiring region as a mask, the $Si_3N_4$ film 103 is etched selectively from above the $SiO_2$ film 102.

Figure 4C:
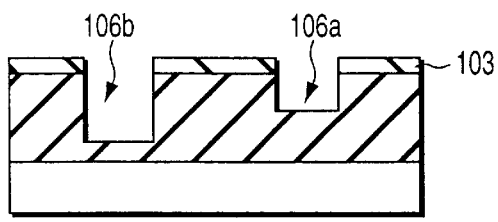

As shown in FIG. 4C, the resist film 105 is exfoliated and the $SiO_2$ film 102 is etched about 500 nm by RIE, using the $Si_3N_4$ film 103 as a mask to form wiring trenches 106a and 106b. As a condition for this etching, the etching rate of the $Si_3N_4$ film 103 is set at about ten or more times as low as that of the $SiO_2$ film. The depths of the wiring trenches 106a and 106b are about 500 nm and 700 nm, respectively, from the surface of the $Si_3N_4$ film 103.

Figure 4D:
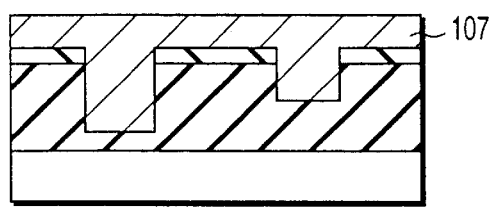
Figure 4E:
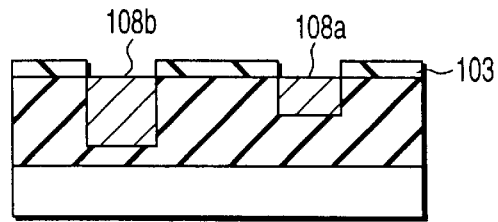

As shown in FIG. 4D, a metal film 107 serving as a wiring is deposited on the whole surface of the resultant structure. Then, as shown in FIG. 4E, the whole surface is polished by CMP to remove an unnecessary portion from the metal film 107 outside the wiring trenches 106a and 106b. In this case, the $Si_3N_4$ film 103 formed on the $SiO_2$ film 102 is used as a polishing stopper for the CMP.

The metal film 107 is buried into the wiring trenches 106a and 106b thereby to complete a single continuous metal film 107 having a thin wiring region 108a and a thick wiring region 108b.

Figure 4F:
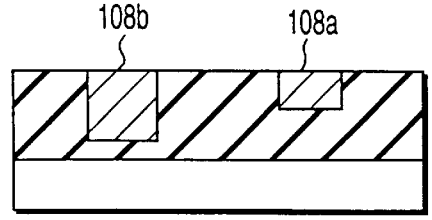

After that, as shown in FIG. 4F, the $Si_3N_4$ film 103 is removed (or can be left as it is) in order to reduce the capacitance between the metal film 107 and its upper wiring (not shown) which is to be formed in the subsequent step. Then, an interlayer insulation film (not shown) is deposited on the resultant structure, and the step of FIG. 4F advances to the next one.

Fourth Embodiment

A method for forming a wiring according to a fourth embodiment of the present invention will now be described with reference to FIGS. 5A to 5F. In these figures, thin and thick regions are shown right and left separately from each other; however, they are formed in a single continuous wiring as in the first embodiment shown in FIGS. 3A to 3F. The same constituting elements as those of the first embodiment are denoted by the same reference numerals and their detailed descriptions are omitted.

Figure 5A:
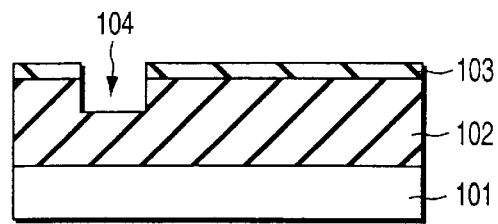
FIGS. 5A to 5E are process cross-sectional views showing a wiring forming method according to a fourth embodiment of the present invention.

As shown in FIG. 5A, a flattened TEOS-SiO$_2$ film 102 having a thickness of about 800 nm is formed on the entire surface of the structure as an interlayer insulation film, as in the first embodiment. Then a Si$_3$N$_4$ film 103 having a thickness of about 50 nm is deposited on the SiO$_2$ film 102, and a wiring trench 104 is formed in the SiO$_2$ film 102 by etching using a resist film (not shown) having a wiring trench pattern in a part of a wiring region as a mask. The depth of the wiring trench 104 is set to about 400 nm from the surface of the Si$_3$N$_4$ film 103.

Figure 5B:
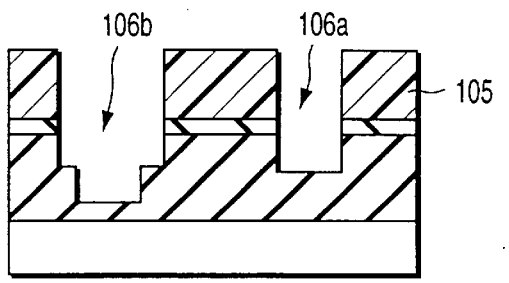

As illustrated in FIG. 5B, using a resist film 105 having an opening pattern in the entire wiring region as a mask, the SiO$_2$ film 102 and Si$_3$N$_4$ film 103 are etched to form wiring trenches 106a and 106b. The width of the opening pattern of the resist film corresponding to the wiring trench 106b is set greater than that of the pattern of the wiring trench 104. Thus, even though the wiring trenches 104 and 106a are slightly out of mask alignment with each other, they can be connected satisfactorily to each other.

Figure 5C:
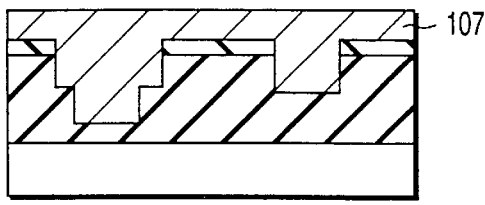
Figure 5D:
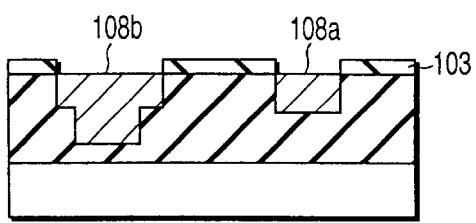

As shown in FIG. 5C, a metal film 107 serving as a wiring is deposited on the whole surface of the resultant structure. Then, as shown in FIG. 5D, the whole surface is polished by CMP to remove an unnecessary portion from the metal film 107 outside the wiring trenches 106a and 106b. In this case, the Si$_3$N$_4$ film 103 formed on the SiO$_2$ film 102 is used as a polishing stopper for the CMP.

The metal film 107 is buried into the wiring trenches 106a and 106b, thereby completing a single continuous metal film 107 having thin and thick wiring regions 108a and 108b.

Figure 5E:
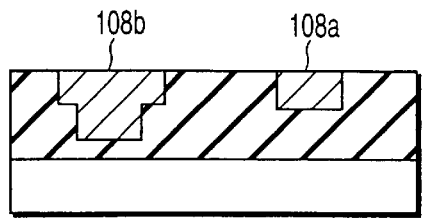

After that, as shown in FIG. 5E, the Si$_3$N$_4$ film 103 is removed (or can be left as it is) in order to reduce the capacitance between the metal film 107 and its upper wiring (not shown) which is to be formed in the subsequent step. Then, an interlayer insulation film (not shown) is deposited on the resultant structure, and the step of FIG. 4F advances to the next one.

Fifth Embodiment

Figure 6:
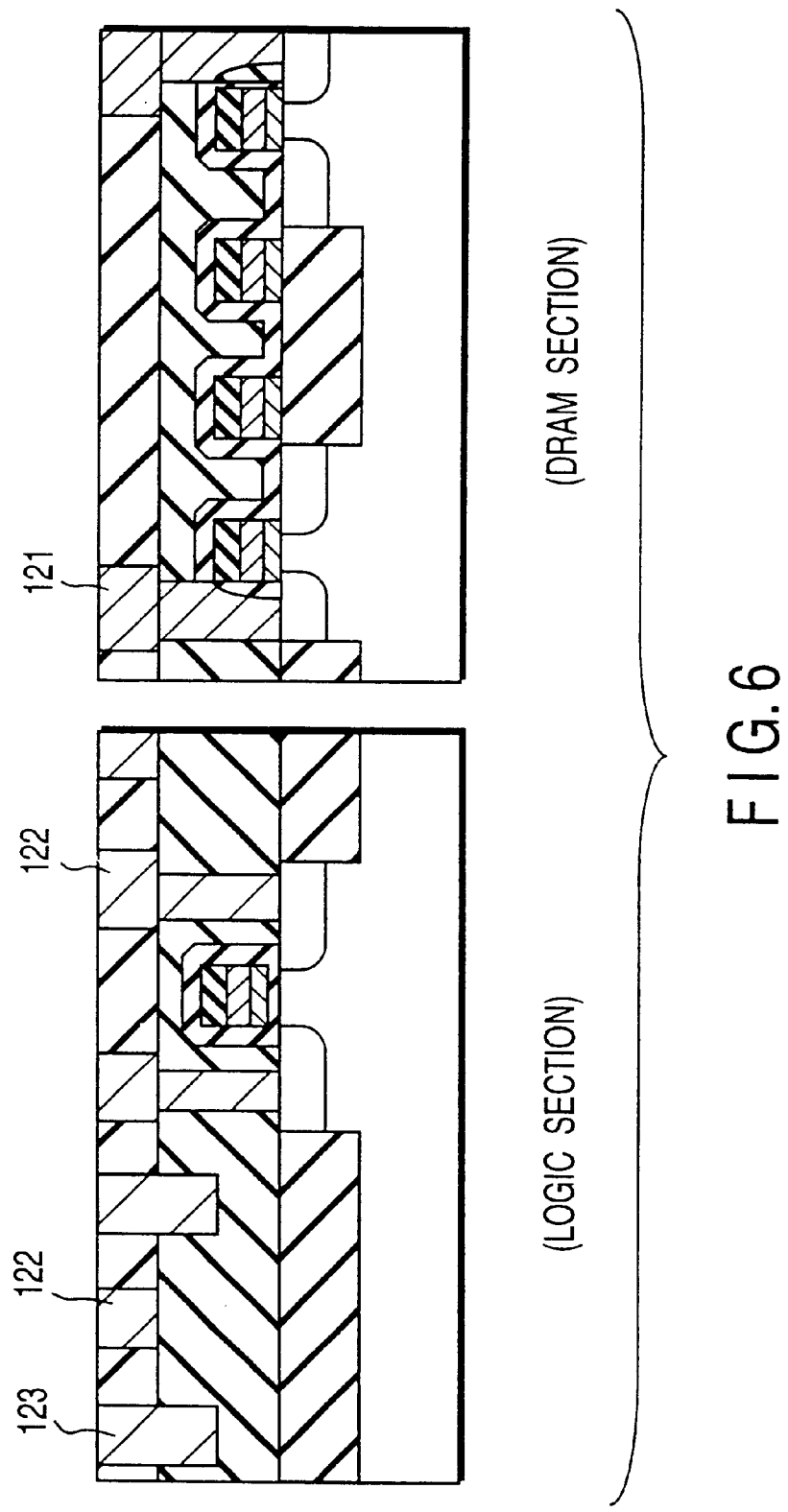
FIG. 6 is a cross-sectional view illustrating a semiconductor device according to a fifth embodiment of the present invention.
Figure 7A:
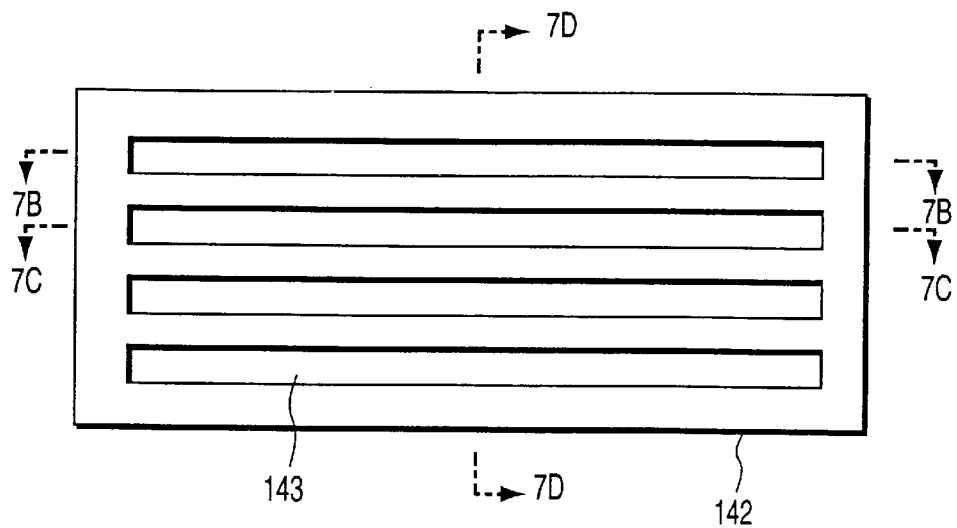
FIGS. 7A to 7D are cross-sectional views showing a first step of a wiring forming method according to a sixth embodiment of the present invention.
Figure 7B:
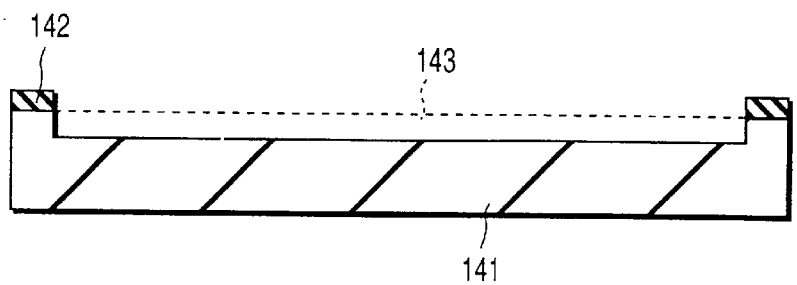
Figure 7C:
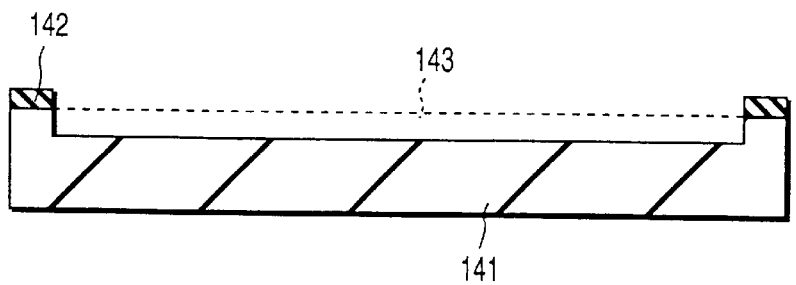
Figure 7D:
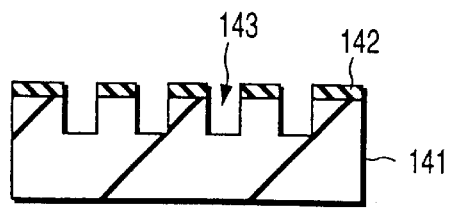
Figure 10A:
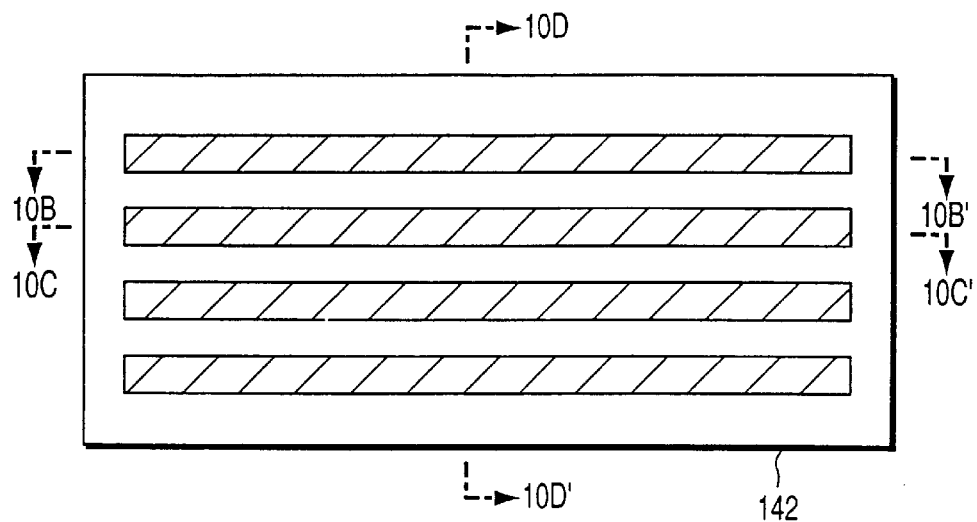
FIGS. 10A to 10D are cross-sectional views of a fourth step subsequent to the third step shown in FIGS. 9A to 9D.
Figure 10B:
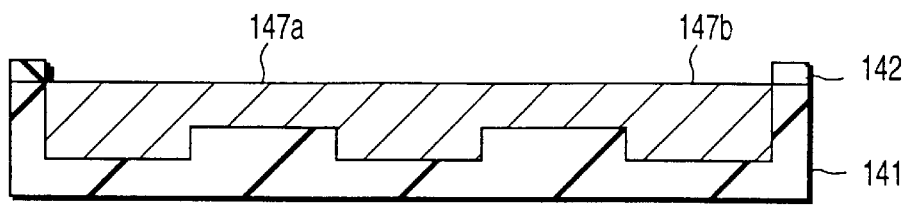
Figure 10C:
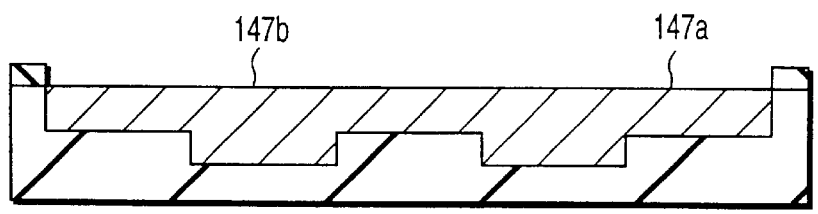
Figure 10D:
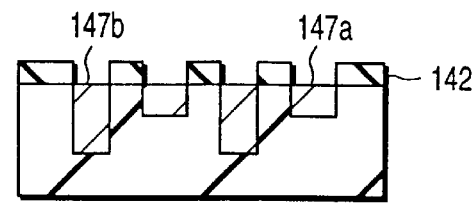
Figure 12A:
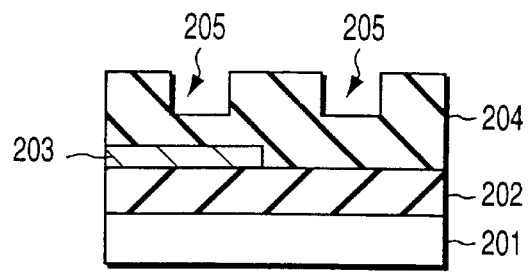
FIGS. 12A to 12D are process cross-sectional views illustrating a prior art wiring forming method.
Figure 12B:
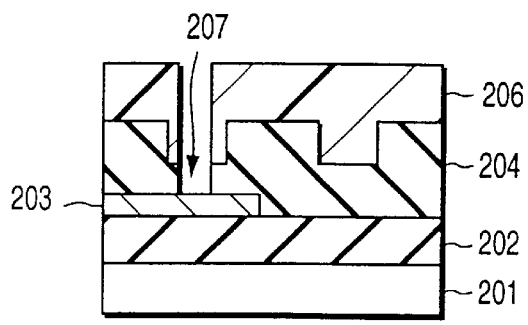
Figure 12C:
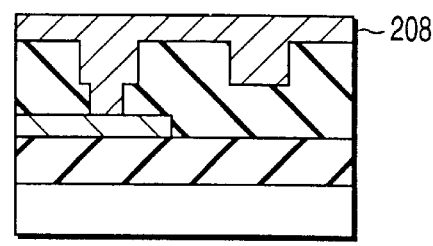
Figure 12D:
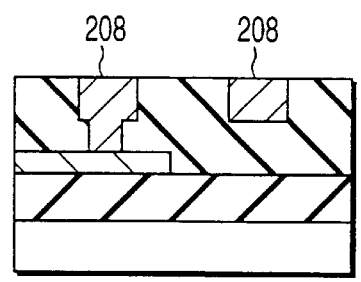
Figure 13:
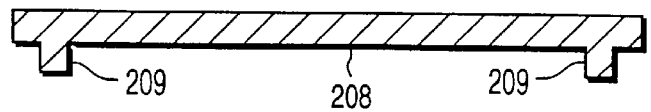
FIG. 13 is a cross-sectional view of prior art wiring having a contact portion.
Figure 14A:
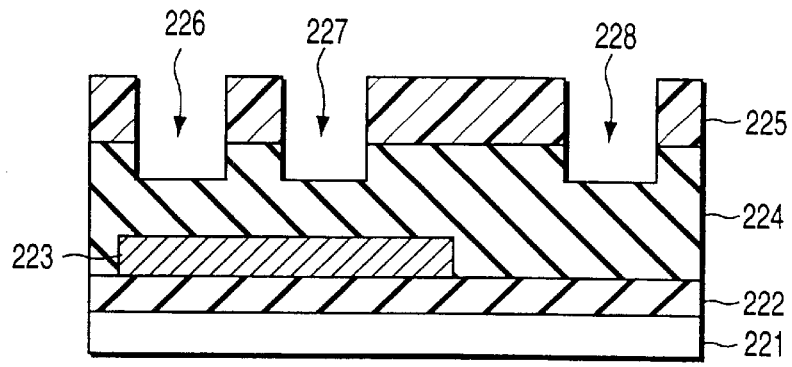
FIGS. 14A to 14D are process cross-sectional views illustrating another prior art wiring forming method.
Figure 14B:
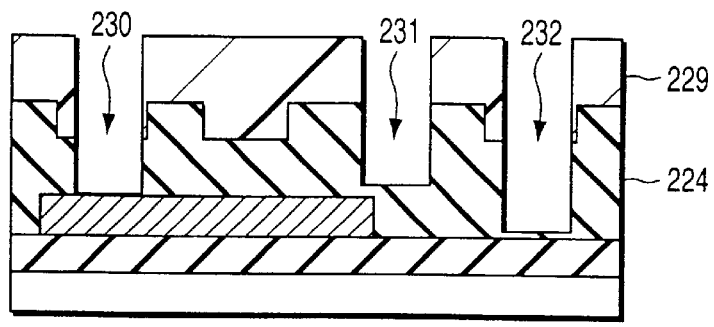
Figure 14C:
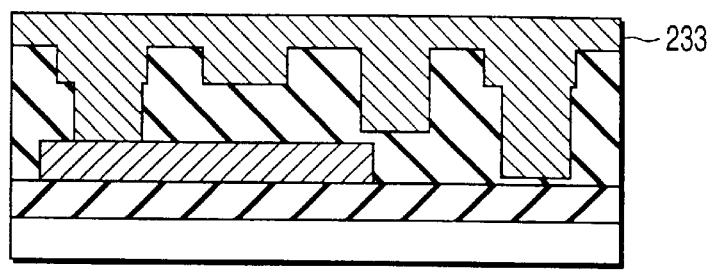
Figure 14D:
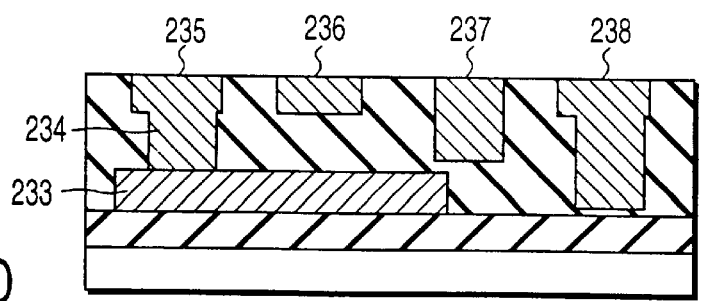

FIG. 6 is a cross-sectional view depicting a semiconductor device according to a fifth embodiment of the present invention. This embodiment is applied to a so-called hybrid DRAM chip in which a DRAM section and a logic section are formed within the same chip and, more specifically, to a wiring region requiring a low wiring resistance like a logic section.

In the DRAM section, a bit line 121 is formed at the minimum pitch and its thickness is set to about 250 nm in order to decrease the wiring-to-wiring resistance. In the logic section, a wiring region 122 having a thickness of about 250 nm and a wiring region 123 having a thickness of about 500 nm are mixed in at least one wiring.

Conventionally the bit line of a DRAM section is formed of a tungsten (W) film. This tungsten bit line can be replaced with an aluminum (Al) wiring and formed simultaneously with an aluminum (Al) wiring used in the logic section. The Al wiring can be formed by processing a pure Al wiring or by processing an Al film containing copper and the like.

A single continuous wiring including the thin and thick wiring regions 122 and 123 is adopted in the logic section, while the wiring 121 having the same thickness as that of the region 122 is formed in the DRAM section. Therefore, the wiring resistance can be decreased in the logic section, as can be the wiring-to-wiring capacitance in the DRAM section, thereby achieving a high-performance hybrid DRAM chip. Moreover, the wirings for both the DRAM and logic sections can be formed through a common process to ease restrictions on design for a connection of both the sections.

Sixth Embodiment

A method for forming a wiring according to a sixth embodiment of the present invention will now be described with reference to FIGS. 7A to 7D, 8A to 8D, 9A to 9D, 10A to 10D and 11A to 11D. Of these figures, A is a plan view, B is a cross-sectional view taken along line B–B' of A, C is a cross-sectional view taken along line C–C' of A, and D is a cross-sectional view taken along line D–D' of A.

In the sixth embodiment, a thin region (having a thickness of about 400 nm) and a thick region (having a thickness of about 700 nm) are formed alternately in the same wiring in the same wiring layer, and a thin region of one of adjacent wirings and a thick region of the other wiring are arranged opposite to each other. In other words, the wiring forming method of the sixth embodiment corresponds to a method for forming the wiring shown in FIG. 1E.

With the above arrangement, both the wiring resistance and the capacitance between adjacent wirings can be decreased at the same time. The basic wiring forming process is almost equal to that of the first embodiment shown in FIG. 3 and thus a detailed description of portions corresponding to those of the first embodiment is omitted.

First, as illustrated in FIGS. 7A to 7D, an element such as a transistor and necessary contact and wiring (not shown) are formed on a silicon substrate (not shown) and then a flattened TEOS-SiO$_2$ film 141 having a thickness of about 800 nm is formed all over the resultant structure as an interlayer insulation film.

As shown in FIGS. 7A to 7D, a Si$_3$N$_4$ film 142 having a thickness of about 50 nm is deposited on the SiO$_2$ film 141 and, using a resist film (not shown) having a trench pattern as a mask, the Si$_3$N$_4$ film 142 and SiO$_2$ film 141 are etched by RIE to form a wiring trench 143 in the SiO$_2$ film 141. The depth of the wiring trench 143 is set to about 400 nm from the surface of the Si$_3$N$_4$ film 142.

As shown in FIGS. 8A to 8D, a resist film 144 having an opening pattern for deepening the wiring trench further, is formed. Using the resist film 144 and Si$_3$N$_4$ film 142 as masks, additional etching is performed by RIE to form a wiring trench 145.

The depth of the wiring trench 145 is set to about 700 nm from the surface of the Si$_3$N$_4$ film 142. In the above additional etching, the etching rate of the Si$_3$N$_4$ film 142 is ten or more times as low as that of the SiO$_2$ film 141.

Thus, a shallow wiring trench and a deep wiring trench are formed alternately in a desired region of a single continuous wiring trench. The shallow wiring trench and deep wiring trench are located opposite to each other between adjacent wirings; therefore, the capacitance between the wirings can be reduced.

Referring then to FIGS. 9A to 9D, the resist film 144 is exfoliated and then a metal film 146, which is to serve as a wiring, is formed on the entire surface of the structure. The entire surface is polished by CMP to remove an unnecessary portion from the metal film 146 outside the wiring trenches 145 and 143, thereby completing a wiring constituted of a single continuous metal film 146 having a thin wiring region 147a and a thick wiring region 147b.

As illustrated in FIGS. 10A to 10D, if the metal film 146 is buried such that its surface is dented more than that of the $Si_3N_4$ film 142, a short circuit can be prevented from being caused between adjacent wirings.

After that, as shown in FIGS. 11A to 11D, in order to reduce the capacitance between the lower wiring of the metal film 146 and the upper wiring (not shown) to be formed in the subsequent step, the $Si_3N_4$ film 142 is eliminated and an interlayer insulation film 148 is deposited, and the step advances to the next wiring step.

The pattern pitch between the thin and thick regions in the length direction of the wiring can depend upon a relationship between the wiring resistance and wiring-to-wiring capacitance and has only to be set properly to a range from 2.0 $\mu$m to 10 $\mu$m. It is usually desirable to set the pattern pitch ten to twenty times as large as the wiring pitch of each of adjacent wirings in their width direction.

In the above embodiment, the thin and thick regions are located opposite to each other between adjacent wirings. However, such a relationship in location need not always be satisfied in the entire wiring region. For example, thin regions can be located opposite to each other at an end portion of the wiring.

It is also desirable that the percentage of a region in which thin and thick wiring regions are opposite to each other be 50% or more in each wiring.

In the sixth embodiment, a method of the wiring having the constitution shown in FIG. 1E is described. However, a wiring having the constitution shown in FIGS. 1F and 1G can be formed by a method pursuant to that of the sixth embodiment.

Furthermore, impedance matching can be improved in a high frequency by properly selecting the thickness of the end portion of a wiring region and the length of the wiring region.

According to the foregoing embodiments, the thickness of wiring can be varied with a predetermined pitch in consideration of the relationship between adjacent wirings, and both the capacitance between the wirings and the wiring resistance can be decreased at the same time.

The present invention is not limited to the above embodiments. Various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a first insulation film on a semiconductor substrate and then forming a second insulation film on the first insulation film;

etching the second insulation film and then the first insulation film to form a first wiring trench in a multilayer film of the second insulation film and the first insulation film;

covering part of the first wiring trench with mask materials;

etching the first insulation film using the mask materials and the second insulation film as masks and deepening other part of the first wiring trench, which is not covered with the mask materials, to form a second wiring trench, which is deeper than the first wiring trench, in part of the multilayer film in which the first wiring trench is formed; and forming a wiring with varying thickness, in the first wiring trench and the second wiring trench, by burying a conductor film inside the first and second wiring trenches;

wherein the first and the second wiring trenches are formed at a different region from a through hole, which is used to connect a conductive region below the first insulation film and the wiring, and wherein the second wiring trench is not directly above the through hole.

2. A method of manufacturing a semiconductor device according to claim 1, wherein the first insulation film is a silicon oxide film and the second insulation film is a silicon nitride film.

3. A method of manufacturing a semiconductor device according to claim 1, wherein the step of forming the wiring includes a step of removing the mask materials, a step of forming a conductive film as the wiring on an entire surface of the multilayer film so as to fill the first and second wiring trenches, and a step of removing the conductive film formed outside the first and second wiring trenches.

4. A method of manufacturing a semiconductor device according to claim 3, wherein the conductive film is removed by chemical mechanical polishing.

5. A method of manufacturing a semiconductor device, comprising the steps of:

forming a first insulation film on a semiconductor substrate and then forming a second insulation film on the first insulation film;

etching the second insulation film and then the first insulation film to form a first wiring trench in a multilayer film of the second insulation film and the first insulation film;

removing part of the second insulation film to expose part of the first insulation film;

etching the first insulation film using the second insulation film as a mask to form a second wiring trench which is deeper than the first wiring trench and form a third wiring trench, which is shallower than the second wiring trench, in the exposed part of the first insulation film; and forming a wiring with varying thickness, in the second and third wiring trenches, by burying a conductor film inside the second and third wiring trenches;

wherein, the first and the second wiring trenches are formed at a different region from a through hole, which is used to connect a conductive region below the first insulation film and the wiring.

6. A method of manufacturing a semiconductor device according to claim 5, wherein the first insulation film is a silicon oxide film and the second insulation film is a silicon nitride film.

7. A method of manufacturing a semiconductor device according to claim 5, wherein the step of forming the wiring includes a step of forming a conductive film as the wiring on an entire surface of the multilayer film so as to fill the second and third wiring trenches, and a step of removing the conductive film formed outside the first and second wiring trenches.

8. A method of manufacturing a semiconductor device according to claim 7, wherein the conductive film is removed by chemical mechanical polishing.

* * * * *

UNITED STATES PATENT AND TRADEMARK OFFICE
CERTIFICATE OF CORRECTION

PATENT NO. : 6,750,142 B2
DATED : June 15, 2004
INVENTOR(S) : Hieda

It is certified that error appears in the above-identified patent and that said Letters Patent is hereby corrected as shown below:

<u>Title page,</u>
Item [62], Related U.S. Application Data, change "Apr. 27," to -- Aug. 27, --.

Signed and Sealed this

Fourteenth Day of September, 2004

JON W. DUDAS
*Director of the United States Patent and Trademark Office*